(12) United States Patent
Topp et al.

(10) Patent No.: US 7,069,653 B2
(45) Date of Patent: Jul. 4, 2006

(54) METHOD FOR ELECTRICALLY CONNECTING A SEMICONDUCTOR COMPONENT TO AN ELECTRICAL SUBASSEMBLY

(75) Inventors: Rainer Topp, Reutlingen (DE); Dirk Balszunat, Tuebingen (DE); Stephan Ernst, Ostfildern (DE); Achim Henkel, Reutlingen (DE); Doerte Eimers-Klose, Reutlingen (DE); Reinhard Milich, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 204 days.

(21) Appl. No.: 10/343,873

(22) PCT Filed: Jul. 20, 2001

(86) PCT No.: PCT/DE01/02755

§ 371 (c)(1),
(2), (4) Date: Sep. 25, 2003

(87) PCT Pub. No.: WO02/13269

PCT Pub. Date: Feb. 14, 2002

(65) Prior Publication Data

US 2004/0038561 A1    Feb. 26, 2004

(30) Foreign Application Priority Data

Aug. 4, 2000 (DE) ................. 100 38 092

(51) Int. Cl.
*H01R 43/00* (2006.01)
(52) U.S. Cl. ............... 29/854; 29/825; 29/827; 29/832; 29/842; 228/160; 257/666; 257/668
(58) Field of Classification Search ........... 29/825, 29/827, 832, 842, 854; 228/160; 257/666, 257/668
See application file for complete search history.

(56) References Cited

U.S. PATENT DOCUMENTS

| 3,922,712 | A |   | 11/1975 | Stryker |        |
|-----------|---|---|---------|---------|--------|
| 4,079,511 | A | * | 3/1978  | Grabbe  | 29/827 |
| 4,413,404 | A | * | 11/1983 | Burns   | 228/160|
| 4,604,678 | A |   | 8/1986  | Hagner  |        |

(Continued)

FOREIGN PATENT DOCUMENTS

DE         39 16 899        11/1990

(Continued)

*Primary Examiner*—Carl J. Arbes
(74) *Attorney, Agent, or Firm*—Kenyon & Kenyon LLP (57) ABSTRACT

A method of establishing an electric connection between electric terminals of a semiconductor component as part of an electric module and additional parts of the electric module by using a punched grid having internal terminal ends and external terminal ends that are electrically connected to the internal terminal ends by metal strip conductors, the semiconductor component and the punched grid are joined so that at least two electric terminals of the semiconductor component are positioned on corresponding internal terminal ends so that a slip-proof mounting of the semiconductor component on the two internal terminal ends is then possible, this mechanical mounting at the same time establishing an electric connection between the electric terminals of the semiconductor component and the internal terminal ends, whereby a metal strip grid, e.g., a punched grid, which, even before being joined to the semiconductor component, has already been embedded on at least one side in at least one partial area in a material that is not electrically conductive, is used as the metal strip grid. This procedure is used for bond-free contacting of semiconductor components for high-power applications in which a power loss of more than 1 Watt may occur.

14 Claims, 6 Drawing Sheets

U.S. PATENT DOCUMENTS

| | | | |
|---|---|---|---|
| 4,616,412 A * | 10/1986 | Schroeder | 29/827 |
| 4,967,261 A | 10/1990 | Niki et al. | |
| 5,202,288 A * | 4/1993 | Doering et al. | 29/827 |
| 5,345,106 A * | 9/1994 | Doering et al. | 257/675 |
| 5,669,137 A | 9/1997 | Ellerson et al. | |
| 5,789,280 A | 8/1998 | Yokota | |
| 6,677,662 B1 * | 1/2004 | Chung et al. | 257/666 |
| 6,781,219 B1 * | 8/2004 | Bissey | 257/666 |

FOREIGN PATENT DOCUMENTS

| | | |
|---|---|---|
| DE | 39 16899 A1 * | 11/1990 |
| JP | 11-265956 * | 9/1999 |
| WO | 98/54760 * | 12/1998 |
| WO | WO 98/54760 | 12/1998 |

* cited by examiner

METHOD FOR ELECTRICALLY CONNECTING A SEMICONDUCTOR COMPONENT TO AN ELECTRICAL SUBASSEMBLY

FIELD OF THE INVENTION

The present invention is directed to a method for electrically connecting a semiconductor component to an electric module.

BACKGROUND INFORMATION

U.S. Pat. No. 3,922,712 describes a method for electrically connecting a semiconductor component to an electric module but in the method a punched grid, initially undivided, is applied to a semiconductor chip to obtain a discrete, housed semiconductor component equipped with contact legs such that the component may be soldered to other circuit components in subsequent steps.

SUMMARY

The method according to the present invention permits contacting of semiconductor power components to additional parts of an electric module in particular by using the fewest possible joining techniques and the fewest possible method steps and without using bond wires, so that the components may be used in adverse environments in particular, such as the engine compartment of a motor vehicle. Contacting without using wire bonds permits a space-saving contacting, because it is not necessary to provide any travel paths for the head of a bonder. In addition, in comparison with bond joints, the method may yield an electric connection which is mechanically more rugged. For high-power applications, it may no longer be necessary to manufacture separate power modules, which are combinations of copper elements with semiconductor chips, which are in turn glued to a heat sink integrated into the housing of the electric module (see, for example, the procedure disclosed in European Patent Application No. 98928076 which corresponds to International Published Patent Application No. WO 98/54760). The surface quality of the metal bodies used need no longer be so high that it is possible to bond directly to them.

A punched grid may be used which is surrounded at least partially on both sides, in particular in the form of a contact frame, by electrically nonconducting material, so that the conductor grid which is subsequently connected directly to the semiconductor chip electrically is self-supporting-and is easy to handle. In the assembled state, it is possible to stack this grid with other punched grids connected by contact frames, these grids in turn contacting additional chips, because electric insulation from one another is ensured not only between the punched grid conductors of one plane due to the at least partial bilateral embedding of the individual punched grids, but also between the punched grid conductors of contact frames stacked together.

A punched grid may be used, i.e., a metal strip grid which is structured so that one of the conductors may be connected to the bottom side of the chip at least in a thermally conducting manner. This may eliminate the need for heat sinks to be provided separately.

In addition, due to the use of a punched grid connected by an electrically nonconducting contact frame, the resulting possibility of a parallel in the process management may be advantageous. In one method step the final electrical and/or thermally conducting connection may be established to both the bottom side as well as the metallized contact areas on the top side of the chip. Thus, the connection to the heat sink and also the connection to the external plugs and connection elements of the electric module are ultimately achieved in one joining step.

Exemplary embodiments of the present invention are illustrated in the drawings and explained in greater detail in the following description.

DETAILED DESCRIPTION

Figure 1:
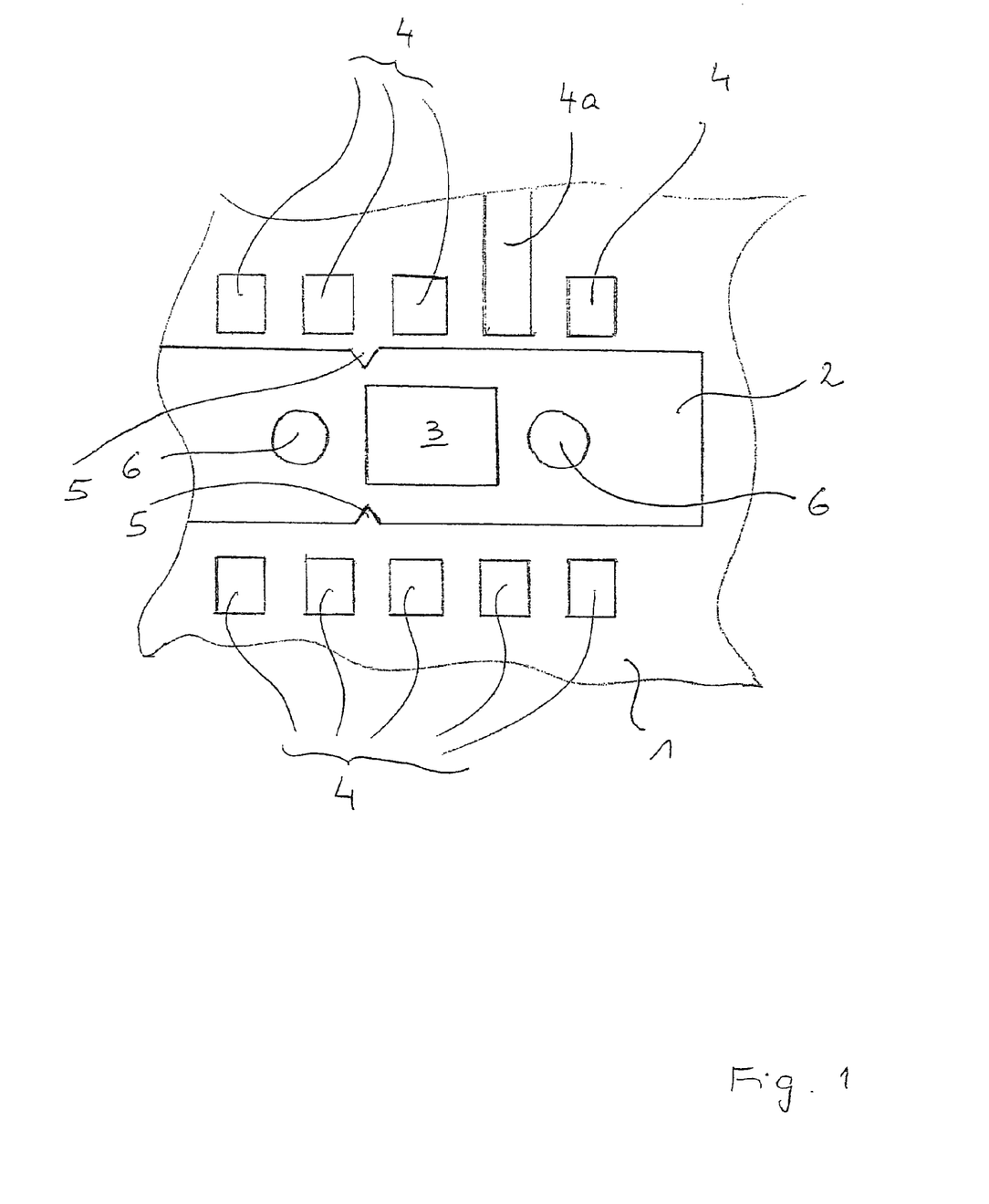
FIG. 1 is a top view of a housing.

FIG. 1 is a top view of housing bottom 1, made of an electrically nonconducting material, of an electric module. Terminal areas 4 and conductor terminal areas 4a have already been introduced into the housing bottom, such as in the form of punched grid conductors, i.e., metal strips or metal squares which have been pressed into a basic mold of the housing bottom while still soft, because it is still hot, and then it is embedded in the housing bottom, e.g., made of plastic. First, a metallic body which serves as heat sink 2 is glued onto or inserted into the housing bottom. The heat sink has two openings 6 through which housing bottom 1 remains visible. Furthermore, heat sink 2 has two notches which function as adjusting marks 5. These are subsequently used for adjustment in the placement of unhoused semiconductor chip 3 on the heat sink. Before applying the chip, it is covered with an electrically conducting joining material, so that in the remaining joining operation, electric contacting of the chip bottom via the heat sink is made possible in addition to allowing the dissipation of heat. An adhesive or solder which conducts electricity may be used here as the joining material.

The terminal regions are to be used to join a semiconductor component, which is subsequently to be contacted electrically to these terminal areas, to other parts of the electric module. These other parts of the electric module may include other discrete semiconductor components or monolithic circuit groups. It is also possible to configure semiconductor terminal area 4a and/or multiple conductor terminal areas in the form of conductor terminal area 4a, so that the punched grid metal strip on an end functions directly as a rigid plug, connection which protrudes out of the housing bottom and by which the electric module as a whole may be plugged into a female connecting element of a separate design. If metal strip 4a has a hole on an end protruding out of the housing bottom, then as an alternative, the electric module may be attached through this hole to the electric terminals of a separate design by screw contacting.

Figure 2:
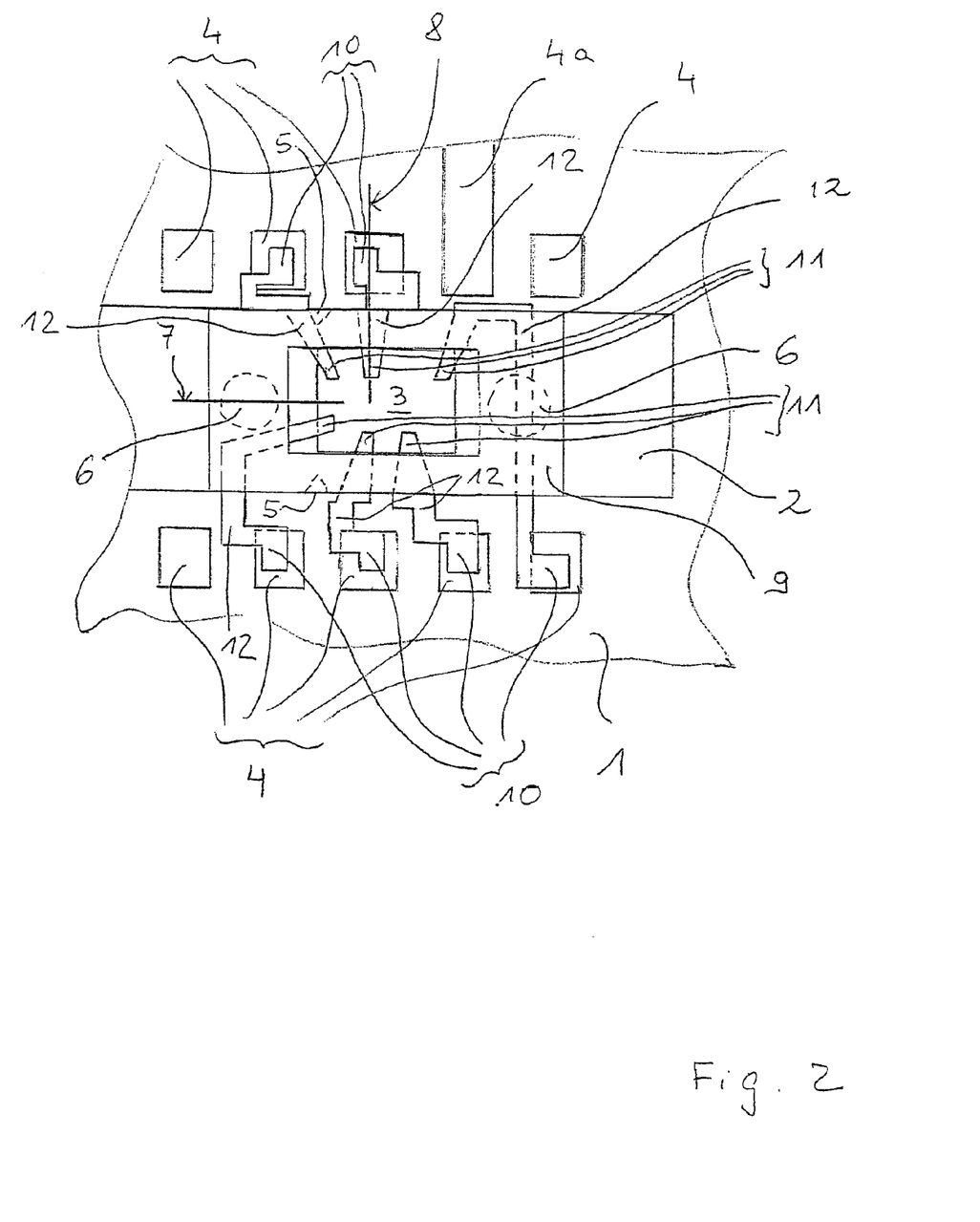
FIG. 2 is a second top view of the housing.

Following the mounting of the semiconductor chip on the heat sink, as illustrated in FIG. 2, a contact frame 9 is applied. The contact frame, composed of electrically nonconducting material, encloses punched conductors 12 having external terminal ends 10 as well as internal terminal ends 11. The contact frame contacts the punched conductors mechanically and thus secures the conductors in their relative positions. The contact frame is situated so that internal terminal ends 11 are contacting metallized contact areas on the surface of the chip while external terminal ends 10 are contacting terminal areas 4. An electrically conducting connecting material (adhesive, solder) has been applied either to the terminal ends and/or to the metallized contact areas, i.e., the terminal areas, for this purpose. In a single concluding joining operation, after premounting the individual components, it is possible to establish electric connections between the external terminal ends and the terminal areas, between the internal terminal ends and the metallized contact areas and between the bottom side of the chip and the heat sink at the same time. Depending on the joining materials used, this may be accomplished by gluing (e.g., at an elevated temperature), soldering, welding, thermocompression, etc. The cross-sections marked with lines 7 or 8 are explained in greater detail in the description of FIGS. 3 and 4.

The use of a contact frame permits simultaneous bonding of upper and lower terminals of the semiconductor chip. With appropriate dimensioning, the contact frame may protect the chip from displacement in the subsequent joining operation by at least one inside edge of the contact frame coming in contact with the chip at the side and thus securing the chip laterally.

As illustrated in FIG. 2, the contact frame may be configured as a closed frame or in the form of a U shape, an angle, a one-sided strip, etc. The contact frame may also be expanded to multichip implementations, i.e., the frame is then configured with dimensions so that a plurality of chips may be contacted simultaneously at internal terminal ends after first being presecured on a substrate.

Figure 3:
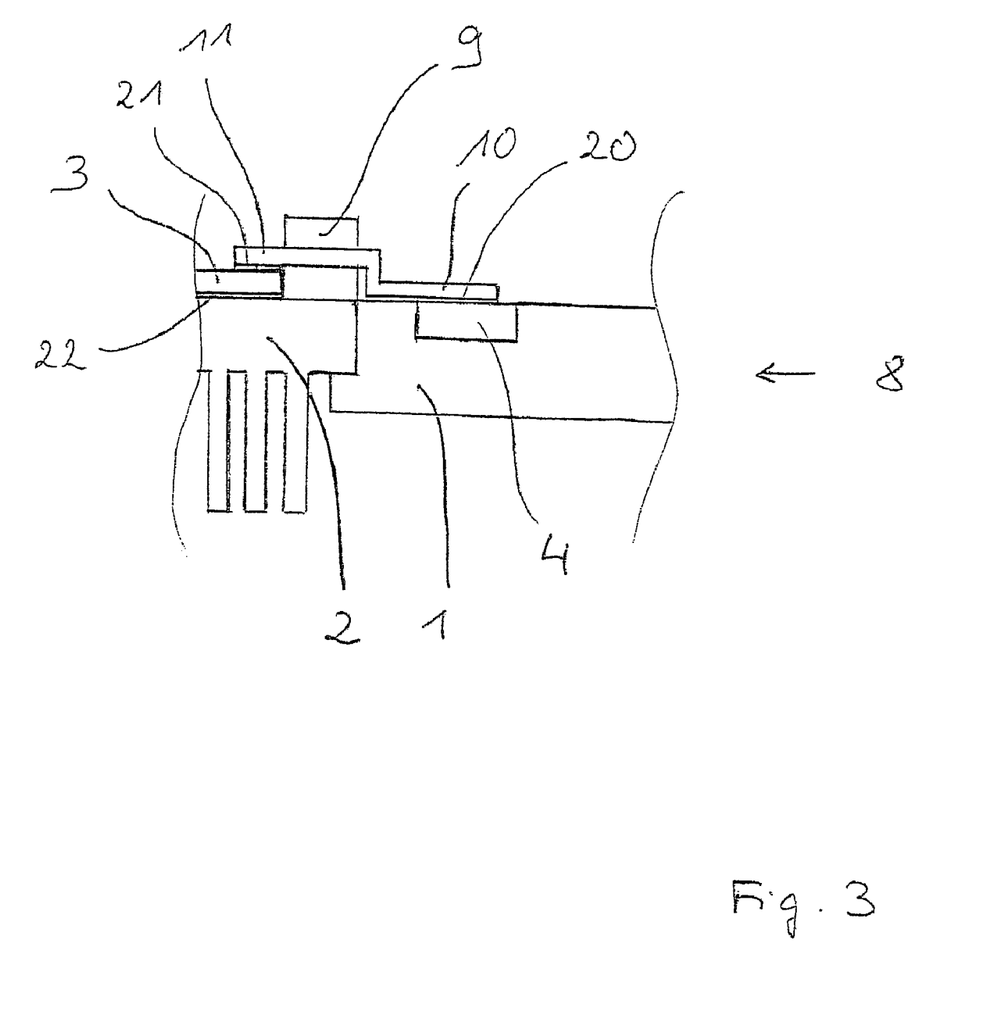
FIG. 3 is a partial cross-sectional view of the housing illustrated in FIG. 2.

FIG. 3 illustrates the cross-section marked with line 8 in FIG. 2. Heat sink 2 has cooling ribs for effective dissipation of the waste heat generated. This cross-section illustrates the arrangement after the joining operation is concluded, after which layers 20, 21, and 22 of joining material between terminal area 4 and external terminal ends 10 and/or between chip 3 and internal terminal ends 11 and/or between chip 3 and heat sink 2 establish a mechanically rigid and electrically conducting connection between heat sink 2 and chip 3 and between chip 3 and terminal areas 4. The punched conductor has a step to compensate for the difference in height between the surface of the chip and the surface of terminal areas 4.

In an alternative example embodiment, the housing bottom may also be configured such that terminal areas 4 and the surface of the chip are situated at the same level, so that punched grid conductors extending only within one plane may be used for the contact frame. In another alternative example embodiment, the heat sink may also be supported by partial areas of the housing bottom over all or part of the area. This is possible in particular when the quantities of heat to be dissipated in operation of the electric module are not so great that there would have to be a direct heat exchange with the ambient air over the entire area beneath the heat sink.

Figure 4:
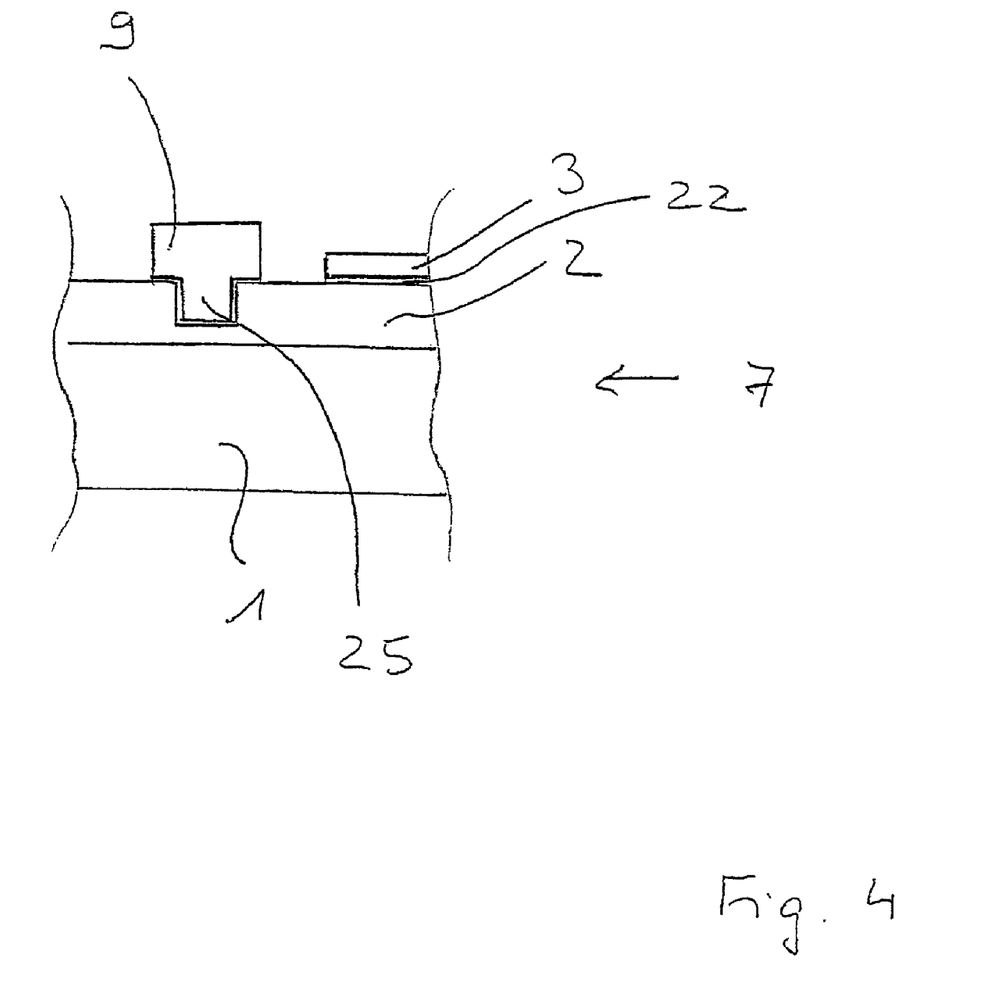
FIG. 4 is another partial cross-sectional view of the housing illustrated in FIG. 2.

FIG. 4 illustrates the cross-section marked by line 7 in FIG. 2. Heat sink 2 has a recess into which a nose element 25 of contact frame 9 protrudes.

This nose element is used to facilitate the adjustment of contact frame 9 relative to housing bottom 1 and/or relative to semiconductor chip 3 situated on the heat sink.

As an alternative, the nose element may be configured as a catch nose element which is able to engage in a suitably configured recess in the heat sink as soon as the semiconductor chip has reached a final position when the contact frame is applied to the heat sink and the semiconductor chip. As an alternative, the recess may extend as far as the housing bottom, or some parts of the housing bottom may even form a continuation of the recess. In the latter case, the recess for a catch nose element may be configured by providing the recess with a slightly larger diameter in the area of the housing bottom than in the area of the heat sink.

Figure 5:
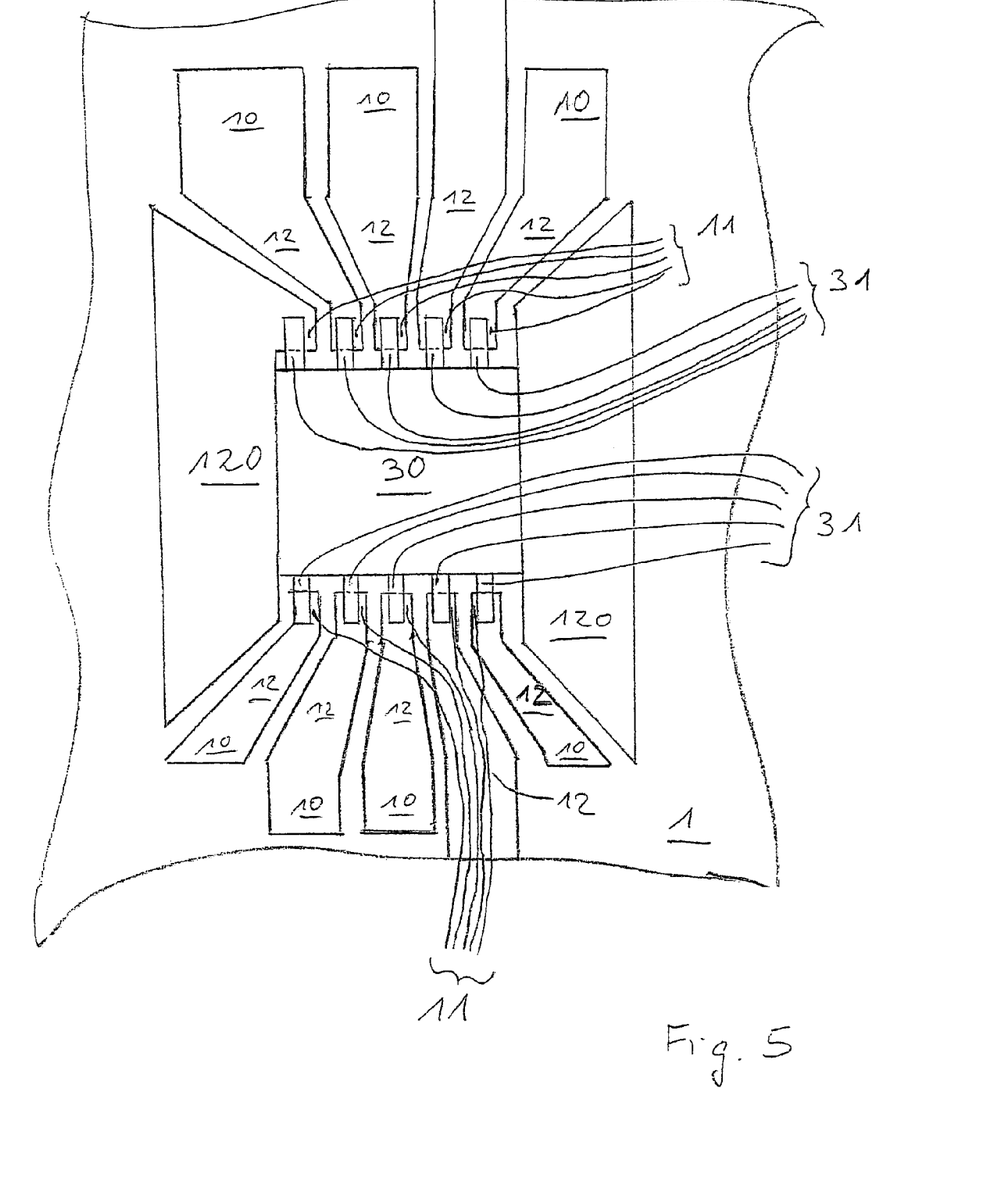
FIG. 5 is a top view of a configuration for establishing an electric connection of a semiconductor component to additional parts of an electric module.

FIG. 5 illustrates another alternative procedure in which a housed semiconductor chip in the form of an SMD component (SMD=surface mount device) 30 having metallic contact legs 31 is connected to punched grid conductors. Punched grid conductors 12 and a heat sink conductor 120 of punched grid material are embedded in housing bottom 1 of the electric module for this purpose. Internal terminal ends 11 of the conductors as well as heat sink 120, also extending beneath SMD component 30 which is to be contacted, are situated so that contact legs 31 and the bottom side of the SMD component may be contacted electrically and/or mechanically so that they may fit together exactly. In the illustrated example, the bottom side of the component contacts heat sink 120, and at the same time contacts the chip electrically via a contact leg. The component is presecured by pressing, the subsequent permanent mounting being accomplished by laser welding, for example. In another step, open terminal points are covered with a suitable electrically insulating casting compound to protect the points from corrosion and mechanical effects (contact, i.e., damage).

The part of the punched grid used for the mechanical mounting thus may simultaneously ensure the dissipation of waste heat of the electronic power module to the environment.

In an alternative example embodiment, the inner terminal ends of conductors 12 have an embossed pattern to facilitate slip-proof premounting of the component.

The SMD housing is a power SMD housing which may be electrically contacted to the lateral terminal legs as well as electrically and thermally connected to the metallic bottom side. It is not sufficient to contact the heat sink via a single contact leg. In laser welding, the reverse side of the SMD, for example, may also be contacted by welding the heat sink to the bottom side of the SMD, in which case the heat sink may have a suitable embossing of a defined thickness so that the laser beam is able to induce fusion between the heat sink and the bottom side of the SMD, working from the bottom side of the heat sink. The electric and thermal flux then proceeds by these fusion points, an adequate number of which may be present. In the case of bonding by laser welding, the terminal legs are "bombarded" by the laser beam from above, while the bonding of the bottom side of the SMD to the heat sink is accomplished by a laser beam which is guided toward it either laterally or from beneath. In another example embodiment, the metallic bottom side of the SMD may also extend above the plastic sheathing of the SMD, thus making it possible to integrate this metal bottom side into the heat sink-by a driving fit. The thermal connection of such a driving fit may be further supported by a thermally conducting paste which is additionally applied between the bottom side of the SMD and the heat sink. As an alternative to laser welding, laser soldering may also be used. To do so, before assembly and contacting of the SMD element, solder paste may be applied to the heat sink and the punched grid conductors in the contact areas. With regard to the laser beam guidance, the same thing may then apply as in the case of laser welding (terminal leg bombarded from above, reverse side of SMD bombarded from the side or from beneath).

Figure 6:
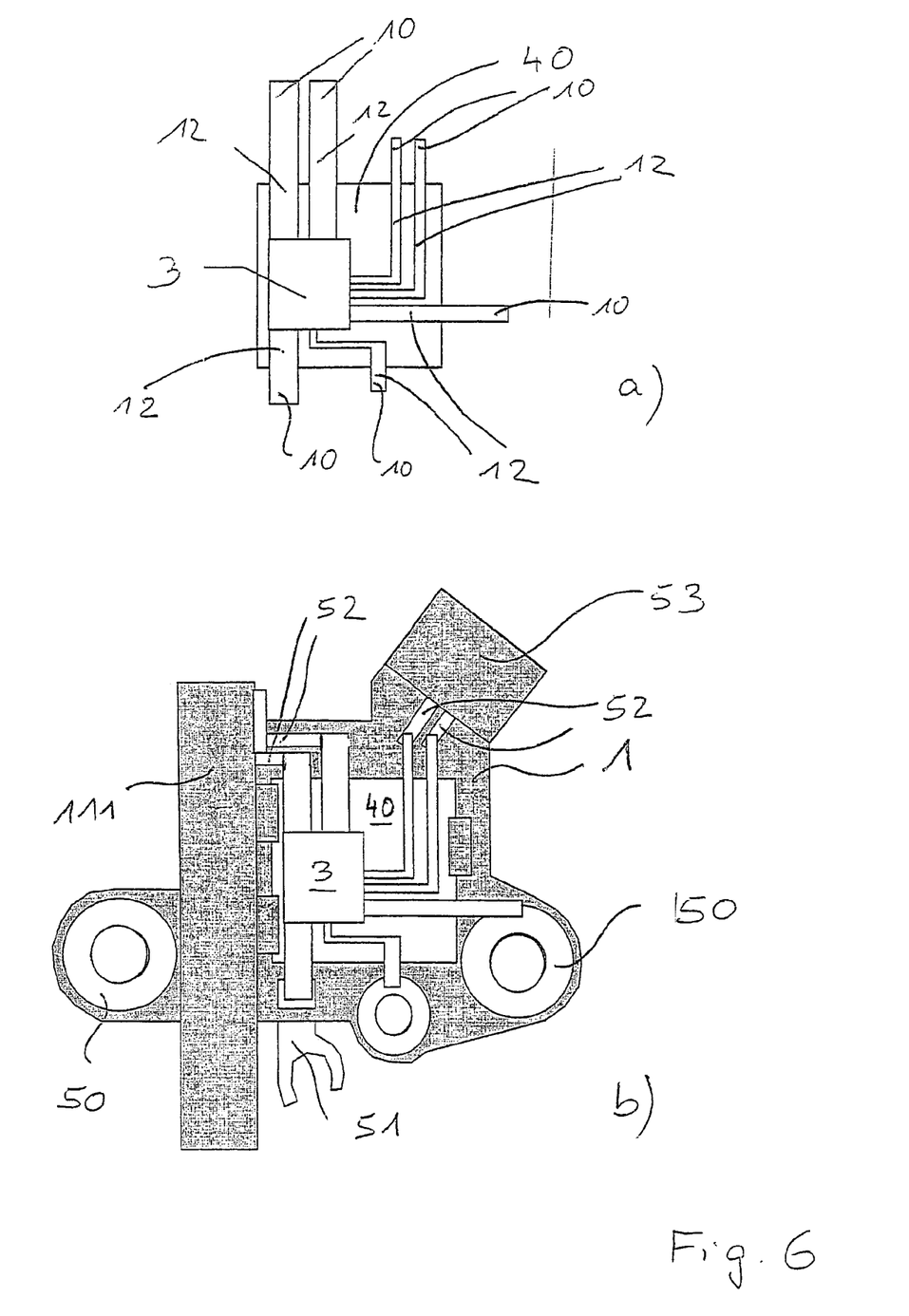
FIGS. 6a and 6b illustrate use of an IMS substrate.

FIG. 6 illustrates another example embodiment of the present invention. FIG. 6a illustrates an IMS (IMS=insulated metal substrate) 40 out of whose top copper layer were created metal strip conductors 12 by structuring before applying chip 3. External terminal ends 10 of the metal strip conductors project above the substrate. IMS substrates here are composed of a thick copper or aluminum base plate. The structurable top side of the copper is insulated from the base plate by a polymer layer. FIG. 6a illustrates the areas on this polymer layer where the copper layer has been removed by structuring. If the structurable copper top side is larger than the base plate, projecting terminal ends may be produced after joining the top side and the base plate with the polymer layer in between. The semiconductor chip is applied to the IMS prepared in this manner by the flip-chip technique. To do so, solder is applied to the metallized contact areas, on the bottom side in the form of bumps and then the chip is soldered to the internal terminal ends of the metal strip conductors (already covered by the chip in FIG. 6a). In another step, the interspace between the chip and the substrate is filled with an underfill material such as AMICON E1252 flip-chip underfill encapsulant (additional manufacturers of underfill materials include, for example, EPOTEC and Loctite) to ensure thermal bonding to the substrate and mechanical stability and corrosion prevention, in particular in the area of the metallized contact areas on the bottom side of the chip. In another step, if this is necessary due to the construction of the housing used here, in which the substrate is to be installed subsequently, the projecting external terminal ends are bent up. This is not necessary if all the terminal faces in the housing construction and the substrate are situated in one plane.

If a structured IMS is used in which the external terminal ends of the metal strip conductors do not project above the substrate, then in parallel with or in close proximity to the time of soldering the chip, protruding conductors may also be superficially soldered to the external terminal ends. In addition, there is also the possibility of soldering additional SMD elements onto the given grid of metal strip conductors.

As illustrated in FIG. 6b, the assembled substrate is then installed in a housing. In the exemplary embodiment, the housing has a housing bottom 1 and a housing wall 111, which is perpendicular to the housing bottom, both of which are made of plastic. Structures that are already electrically conducting in the form of punched grid conductors 52 (surrounded partially or completely, e.g., by the plastic material) are introduced into the plastic housing. After assembly of the substrate, they may establish an electric connection to a terminal element 51, metallic terminal eyes 50, and a plug element 53. The plastic housing is configured, for example, so that the assembled substrate is inserted into a matching opening, and after reaching the final position, it is secured by locking elements, in particular clip elements. Punched grid conductors 52 and/or terminal eyes 50 and metal strip conductors 12 are situated here so that the external terminal ends of the metal strip conductors projecting beyond the substrate come to lie on the ends of the punched grid conductors and/or on the edge areas of the metallic terminal eyes. The final mechanical fixation, which at the same time establishes a permanent electric connection between the metal strip conductors and the punched grid conductors, is then established by laser welding. Then the arrangement is passivated by applying a gel to the substrate and to the contacted punched grid conductors of the housing. Then the housing may be sealed with a cover.

As an alternative to laser welding, other techniques such as soldering, laser soldering, ultrasonic welding, conductive gluing, etc. may also be used. Solder or conductive adhesive may be applied either to the punched grid conductors or to the external terminal ends of the metal strip conductors before inserting the substrate. In any case, no surfaces which would be suitable for wire bonding may be needed on the punched grid conductors or the other insertion parts (terminal eyes, etc.), because all electric contacting occurs by rigid metal strips, i.e., punched grids. As an alternative to application of gel, it is also possible to use casting in a resin compound, molding, lacquer coating, or application of a glob top mass for passivation. These are techniques that are usually used to cover a chip after mounting it on a substrate by the flip-chip technique.

What is claimed is:

1. A method for establishing an electrical connection between electric terminals of a semiconductor component as part of an electric module and additional parts of the electric module comprising:

providing a metal strip grid having internal terminal ends and external terminal ends that are electrically connected to the internal terminal ends by at least two metal strip conductors;

joining the semiconductor component and the metal strip grid, wherein the semiconductor component includes an unhoused semiconductor chip which has electric terminals formed by metallized contact areas, such that at least two electric terminals of the semiconductor component are positioned on corresponding internal terminal ends so that a slip-proof mounting of the semiconductor component on the two internal terminal ends occurs;

establishing an electrical connection between the electrical terminals of the semiconductor component and the internal terminal ends by the mounting;

wherein the metal strip grid before being joined to the semiconductor component has been connected on at least one side in at least one partial area to a material that is not electrically conductive, wherein the metal strip grid includes a punched grid surrounded on both sides in at least part of the partial area by electrically nonconducting material, the electrically nonconducting material forming a contact frame that establishes the connection and fixation of the at least two metal strip conductors forming the conductors relative to one another;

introducing a metallic body that functions as a heat sink into an electrically nonconducting housing;

covering the semiconductor component on a bottom side with an electrically conductive bonding material;

positioning the semiconductor component on the metallic body;

covering one of the electric terminals on the top side of the semiconductor component and the internal terminal ends of the punched grid with one of the electrically conducting bonding material and another electrically conducting bonding material;

positioning the punched grid to lie with the external terminal ends on terminal areas of the additional parts of the electric module at a same time; and mounting the external terminal ends to the terminal areas simultaneously.

2. The method according to claim 1, further comprising securing the semiconductor chip at a same time during the mounting so that the chip is protected from slippage by an inside edge of the conductive material.

3. The method according to claim 1, further comprising presecuring the punched grid during positioning by a nose element mounted on the metal strip grid of electrically nonconducting material to engage in an opening in the heat sink.

4. The method according to claim 3, wherein the nose element locks in the opening.

5. A method for establishing an electrical connection between electric terminals of a semiconductor component as part of an electric module and additional parts of the electric module comprising:
   providing a metal strip grid having internal terminal ends and external terminal ends that are electrically connected to the internal terminal ends by at least two metal strip conductor;
   joining the semiconductor component and the metal strip grid such that at least two electric terminals of the semiconductor component are positioned on corresponding internal terminal ends so that a slip-proof mounting of the semiconductor component on the two internal terminal ends occurs; and
   establishing an electrical connection between the electrical terminals of the semiconductor component and the internal terminal ends by the mounting;
   wherein the metal strip grid before being joined to the semiconductor component has been connected on at least one side in at least one partial area to a material that is not electrically conductive, the electrically nonconducting material forming a contact frame that establishes the connection and fixation of the at least two metal strip conductors forming the conductors relative to one another, and wherein the semiconductor component includes an SMD component, the electric terminals including metallic contact legs of the SMD component, the metal strip grid embedded in part in an electrically nonconducting housing of the electric module.

6. The method according to claim 5, wherein the mounting includes first presecuring the SMD component by pressing the contact legs against the internal terminal ends, and wherein the method further comprises welding the contact legs.

7. The method according to claim 5, wherein the metal strip grid includes embossing on the internal terminal ends for slip-proof positioning of the contact legs.

8. The method according to claim 1 wherein the electrically nonconducting material of the metal strip grid includes a nonconducting layer of a substrate.

9. The method according to claim 8, wherein the substrate is flat.

10. The method according to claim 8, wherein the electrically nonconducting material includes a polymer layer.

11. The method according to claim 10, wherein the polymer layer includes part of an IMS substrate.

12. The method according to claim 8, wherein the slip-proof mounting of the semiconductor component includes a flip-chip technique.

13. The method according to claim 11, further comprising filling an interspace between the IMS substrate and the semiconductor component with a thermal conductor material after mounting the semiconductor component.

14. The method according to claim 8, further comprising installing the substrate and the semiconductor component mounted on the substrate in a housing.

\* \* \* \* \*